(12) United States Patent
Fan et al.

(10) Patent No.: US 6,998,335 B2
(45) Date of Patent: Feb. 14, 2006

(54) STRUCTURE AND METHOD FOR FABRICATING A BOND PAD STRUCTURE

(75) Inventors: Zhang Fan, Singapore (SG); Zhang Bei Chao, Singapore (SG); Liu Wuping, Singapore (SG); Chok Kho Liep, Singapore (SG); Hsia Liang Choo, Singapore (SG); Lim Yeow Kheng, Singapore (SG); Alan Cuthbertson, Newcastle Upon Tyne (GB); Tan Juan Boon, Singapore (SG)

(73) Assignee: Chartered Semiconductor Manufacturing, LTD, Singapore (SG)

( * ) Notice: Subject to any disclaimer, the term of this patent is extended or adjusted under 35 U.S.C. 154(b) by 36 days.

(21) Appl. No.: 10/735,117

(22) Filed: Dec. 13, 2003

(65) Prior Publication Data

US 2005/0127530 A1    Jun. 16, 2005

(51) Int. Cl.
*H01L 21/44*    (2006.01)
(52) U.S. Cl. ............... 438/612; 438/614; 438/622; 438/627; 438/637
(58) Field of Classification Search ............... 438/612, 438/614, 618, 622, 626, 627, 629, 631, 637, 438/638, 643, 645
See application file for complete search history.

(56) References Cited

U.S. PATENT DOCUMENTS

| 4,636,832 A | 1/1987 | Margalit et al. |
| 5,084,752 A | 1/1992 | Satoh et al. |
| 5,149,674 A | 9/1992 | Freeman, Jr. et al. |
| 5,502,337 A | 3/1996 | Nozaki |
| 5,751,065 A | 5/1998 | Chittipeddi et al. |
| 5,923,088 A | 7/1999 | Shiue et al. |
| 6,020,647 A | 2/2000 | Skala et al. |
| 6,271,082 B1 * | 8/2001 | Hou et al. .................. 438/250 |
| 6,830,971 B1 * | 12/2004 | Balakumar et al. ......... 438/638 |

* cited by examiner

*Primary Examiner*—Kevin M. Picardat
(74) *Attorney, Agent, or Firm*—William J Stoffel

(57) ABSTRACT

A structure and method for an improved a bond pad structure. We provide a top wiring layer and a top dielectric (IMD) layer over a semiconductor structure. The buffer dielectric layer is formed over the top wiring layer and the top dielectric (IMD) layer. We form a buffer opening in the buffer dielectric layer exposing at least of portion of the top wiring layer. We form a barrier layer over the buffer dielectric layer, and the top wiring layer in the buffer opening. A conductive buffer layer is formed over the barrier layer. We planarize the conductive buffer layer to form a buffer pad in the buffer opening. We form a passivation layer over the buffer pad and the buffer dielectric layer. We form a bond pad opening in the passivation layer over at least a portion of the buffer pad. We form a bond pad support layer over the buffer pad and the buffer dielectric layer. We form a bond pad layer over the a bond pad support layer. The bond pad layer and the bond pad support layer are patterned to form a bond pad and bond pad support.

25 Claims, 4 Drawing Sheets

STRUCTURE AND METHOD FOR FABRICATING A BOND PAD STRUCTURE

BACKGROUND OF INVENTION

1) Field of the Invention

The present invention generally relates to a semiconductor device, and more specifically, to a bonding pad electrode structure and to a bond pad structure that prevents generation of cracks derived from mechanical stress from wire bonding.

2) Description of the Related Art

Integrated circuits must be electrically contacted. The electrical connection from the external pins of the integrated circuit package to the integrated circuit goes through bond pads which are located on the periphery of the integrated circuit. The bond pads are metal areas which are electrically connected to the devices in the integrated circuit via and electrically conducting wiring layers (e.g., Metal layers). Due to conventional bonding technology used to, for example, attach wires to the bond pads and to design constraints, the bond pads have relatively large dimensions as compared to the device dimensions and occupy or cover a significant portion of the chip surface. The area underneath the bond pads thus occupies a substantial fraction of the entire chip surface.

The electrical connection between the package and the bond pad requires physical integrity as well as high electrical conductivity. The conventional bonding process used to form the connection typically requires either or both elevated temperatures, high pressures and ultrasonic energy to produce a good connection between the wire and the bond pad. If the bond pad is on a dielectric, the bonding conditions produce mechanical stresses in the dielectric. The stress may cause defects which result in leakage currents through the dielectric between the bond pads and the underlying substrate, which is frequently electrically conducting. The leakage currents preclude use of the substrate area under the bond pads for device purposes thereby decreasing the efficiency of substrate utilization for device purposes.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,084,752 (Satoh et al.) that shows an embodiment a bonding pad comprising a buffer layer.

U.S. Pat. No. 4,636,823 (Abe) shows a bond pad over a polysilicon layer.

U.S. Pat. No. 5,149,674 (Freeman, Jr. et al.) shows bond pad.

U.S. Pat. No. 5,751,065 (Chittipeddi et al.) shows a bond pad.

U.S. Pat. No. 5,923,088 (Shiue et al.) shows a bond pad structure.

U.S. Pat. No. 6,020,647 (Skala et al) reveals a bond pad structure with patterned features.

U.S. Pat. No. 5,502,337 (Nozaki) shows a bonding pad with multiple interconnect layers.

However, there is a need for an improved bonding pad.

SUMMARY OF THE INVENTION

An embodiment of the present invention provides a structure and method of manufacturing a bond pad which is characterized as follows. We provide a top wiring layer and a top dielectric (IMD) layer over a semiconductor structure. The buffer dielectric layer is formed over the top wiring layer and the top dielectric (IMD) layer. We form a buffer (pad) opening in the buffer dielectric layer exposing at least of portion of the top wiring layer. We form a barrier layer over the buffer dielectric layer, and the top wiring layer in the buffer opening. A conductive buffer layer is formed over the barrier layer. We planarize the conductive buffer layer to form a buffer pad in the buffer (pad) opening. We form a passivation layer over the buffer pad and the buffer dielectric layer. We form a bond pad opening in the passivation layer over at least a portion of the buffer pad. We form a bond pad support layer over the buffer pad and the buffer dielectric layer. We form a bond pad layer over the a bond pad support layer. The bond pad layer and the bond pad support layer are patterned to form a bond pad and bond pad support.

The buffer pad and the (bond pad) support layer under the bond pad provide the stress relief needed so that the integrity of the dielectric layers is not destroyed during the bonding process. Furthermore, the buffer pad can have a larger area than the bond pad and therefore can provide more support.

The above advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Introduction

New wire bonding processes and Low K dielectric layers under the bond pads have raised the stress requirement for bond pads. With the semiconductor technology move on to Cu/Low K integration, wire-bonding became one of the challenges due to the low modulus and fracture toughness of low K materials.

The inventors have found an improved bond pad structure is needed because (1) particular Low K dielectric are being used that have lower mechanical strength compared to $SiO_2$ and 2) the wire bonding process are putting increased stress on bond pad and chips.

The wafers are often built up to 6 layers of Cu separated by Low K dielectrics, which themselves must be surrounded by diffusion barriers. In wire bonding, mechanical loading and ultra-sonic stresses applied by the tip of the bonding capillary to the bond-pad could also transmit to the underlying Cu/Low K stacks. Since Low K materials are not strong enough, bond-pad deformation or sinking could normally be observed. This could further cause the deformation or delamination of dielectric layers. Although the damages (most of the times in the form of micro-cracks) sometimes may be not apparent during wire-bonding process, they may progress to fatal fractures when subjected to thermo-mechanical stresses generated during the plastic encapsulation, accelerated reliability testing, temperature cycling and device operations. These may be shown as chip-outs of mechanically weak low k dielectric film together with metal, or as bond-pad lifting and delamination between Cu/Low K films. Beside wire-bonding process optimization, new bond-pad or supporting structure design is also necessary to solve the above issue. In addition as the semiconductor moving towards Ultra Low k dielectrics, which are even softer and less robust than current Low K materials, in the future, the wire-bonding issue will be more stringent. Therefore, new bond-pad design is necessary.

Method for an Embodiment of the Bond Pad Structure

Exemplary embodiments of the present invention will be described in detail with reference to the accompanying drawings. The embodiment provide structure for a bonding pad and a method of forming a bond pad structure that has improved tolerance to stress.

Top Wiring Layer 22 and Top Dielectric (IMD) Layer 20

Figure 1:
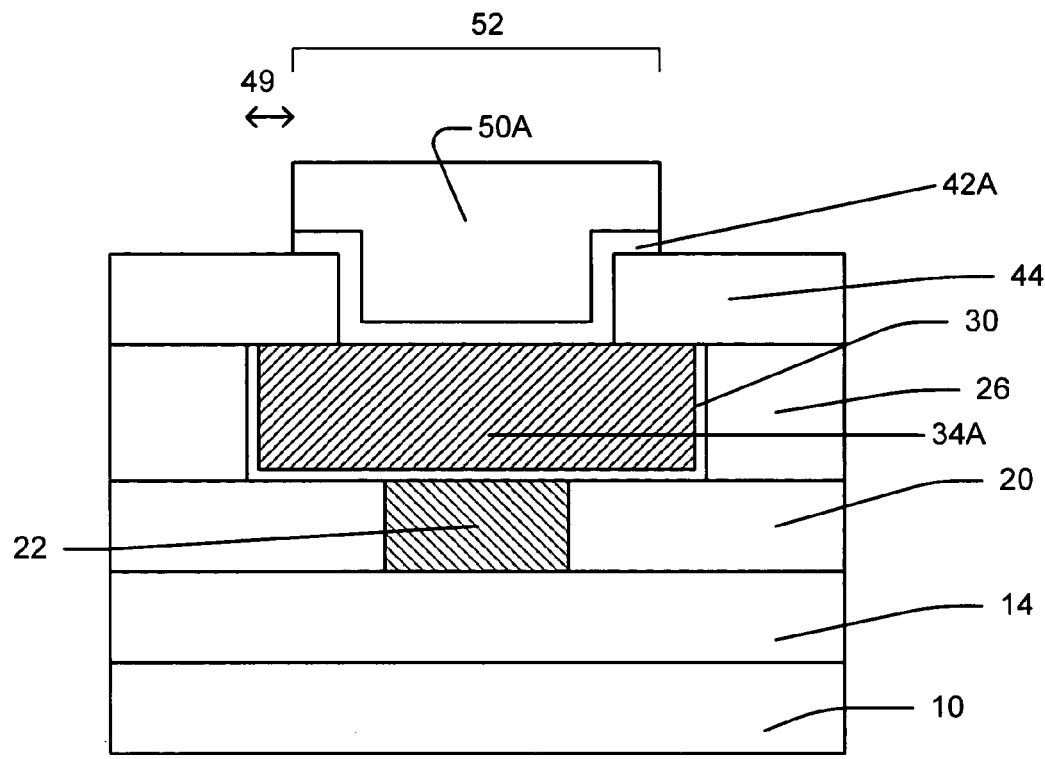
FIG. 1 is cross sectional view for illustrating an embodiment of the bond pad structure according to the present invention.
Figure 2:
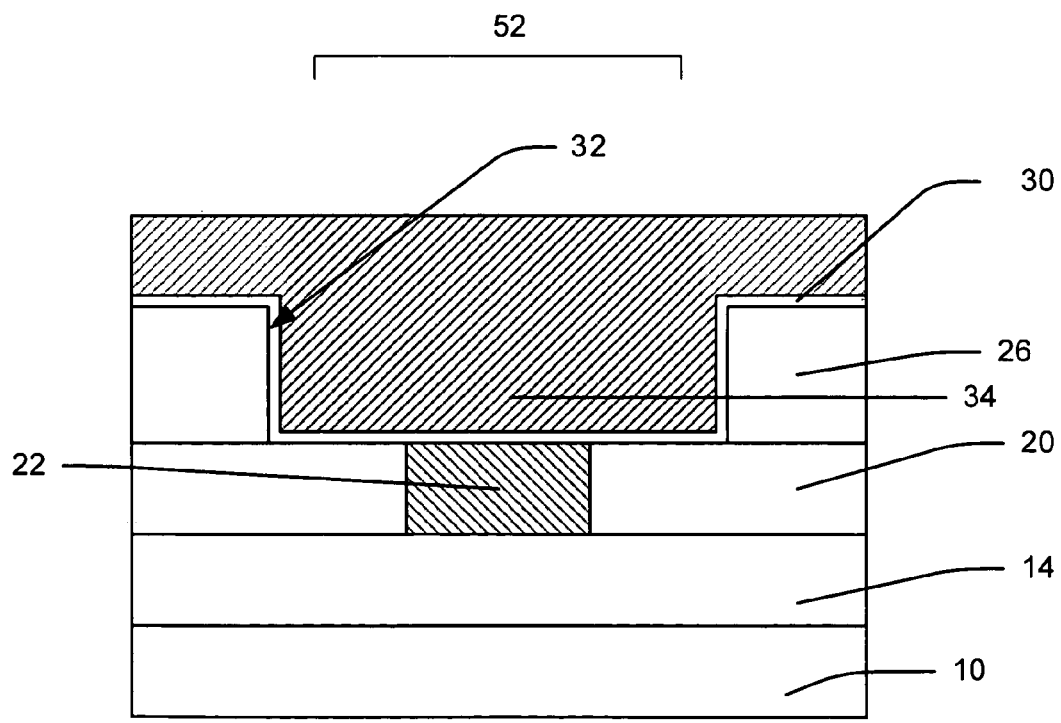
FIGS. 2 through 5 are cross sectional views for illustrating a method for manufacturing an embodiment of the bond pad structure according to the present invention.

Referring to FIG. 2, we provide a top wiring layer 22 and a top dielectric (IMD) layer 20 over a semiconductor structure 10.

The semiconductor structure 10 can be a wafer with dielectric and conductive layers thereover. Semiconductor Structure 10 is understood to possibly include a semiconductor wafer, active and passive devices formed within the wafer; and insulating and conductive layers formed on the wafer surface. Insulating layers can include interlevel dielectric layers and inter metal dielectric layers. Conductive layers can include contacts and $1^{st}$ thru n-1 level conductive layers (e.g., $1^{st}$ level metal or poly to n-1 level). The term "structure surface" is meant to include the upper most exposed layers over a semiconductor wafer, such as a silicon surface, an insulating layer and/or conductive lines.

Semiconductor structure can refer generally to a wafer or die having an intermediate integrated circuit structure formed thereon, typically including a silicon or other semiconductor layer having transistor or other semiconductor devices formed therein, dielectric layers over the semiconductor layer, metal or other conductive contacts extending down and through the dielectric layers to the semiconductor layer and interconnects (e.g., metal layers and via contacts or dual damascene structures) extending laterally over the surface of the dielectric layers.

An inter metal dielectric (IMD) layer 14 is formed over the semiconductor structure 10. The IMD layer 14 can be comprised of a low-k material. Also, metal interconnect lines (n-1 level. e.g., level M5 in a M6 level design) (not shown) can be formed over the structure 10. Low K materials (e.g., K=or<3.0) have lower strengths than silicon oxide. Examples of Low K/low strength materials that have low strength are CORAL™ film, Black diamond™ film, SiLK™ film. etc. Black diamond films are methyl-doped porous silica films. The embodiment's bond structure reduces stress on these low strength/low k layers.

The top wiring layer 22 is preferably comprised of Cu alloy. The top wiring layer preferably is a copper damascene interconnect (e.g., TM-Cu). The top wiring layer is the upper most interconnecting layer (e.g., metal level 6 in a 6 metal layer IC). Typically, under the top metal layer 22 and top dielectric layer are levels of wiring and inter metal dielectric layers. When the IMD's layers are formed of a low K material, the problems of bonding pad deformation and sinking can occur during wire-bonding which can lead to damage to the underlying Low K/Cu structures.

The top dielectric (IMD) layer 20 can be comprised of a dielectric material, such as a oxide formed using TEOS, or a low K material. Low K materials with low strengths that are especially venerable to bonding pad problems are low k materials with K equal to or less than 3.0, such as porous silica films (e.g., black diamond™ films) The top dielectric layer 20 is preferably comprised of TEOS (oxide formed using TEOS) and has a thickness between 6750 and 8250 Å and more preferably of about 7500 angstroms. Alternately, the top dielectric layer 20 is comprised of undoped silicate glass (USG).

Buffer Dielectric Layer 26

Next we form a buffer dielectric layer 26 over the top wiring layer 22 and the top dielectric (IMD) layer. The buffer dielectric layer 26 is preferably comprised of oxide formed using TEOS, or undoped silicate glass (USG). Preferably the buffer dielectric layer is comprised of TEOS.

The buffer dielectric layer preferably has a thickness between 6750 and 8250 Å.

The buffer dielectric layer 26 is not an inter metal dielectric (IMD) layer because no metal wiring layers (e.g., (M6) interconnecting layers) are formed on this level or above. The buffer dielectric layer is not a passivation layer. The passivation layer 44 is preferably formed over the buffer dielectric layer.

Buffer Opening 32 in the Buffer Dielectric Layer

Still referring to FIG. 2, we form a buffer (pad) opening 32 in the buffer dielectric layer 26 exposing at least of portion of the top wiring layer 22. The buffer (pad) opening 32 is in a bond pad area 52.

Barrier Layer 30

As shown in FIG. 2, we form a barrier layer 30 over the buffer dielectric layer 26, and the top wiring layer 22 in the buffer opening 32.

The barrier layer 30 is preferably comprised of Ta or a bilayer comprised of a Cr layer and a CrCu layer (e.g., Cr/CrCu bilayer). The barrier layer 30 preferably has a thickness between 360 and 440 Å.

Conductive Buffer Layer 34 and Buffer Pad 34A

As FIG. 2 displays, we form a buffer (pad) conductive layer 34 over the barrier layer 30. The buffer conductive layer preferably is relatively soft and ductile (e.g., Al) to absorb the bonding energy.

The conductive buffer layer 34 is preferably comprised of an aluminum alloy such as a 99.5 wt % aluminum and 0.5 wt % Copper. The conductive buffer layer 34 is preferably comprised of an aluminum alloy with between a 99.45 and 99.55 wt % aluminum and between 0.45 and 0.55 wt % Copper.

The conductive buffer layer be made of more than 1 layer, such as 2 or 3 layers. The conductive buffer layer is preferably comprised of aluminum. Aluminum is softer and more ductile than Cu. Another consideration for the choice of material for the conductive buffer layer is compatibility with the current process flow.

The conductive buffer layer 34 has a thickness between 6000 and 15,000 Å.

Figure 3:
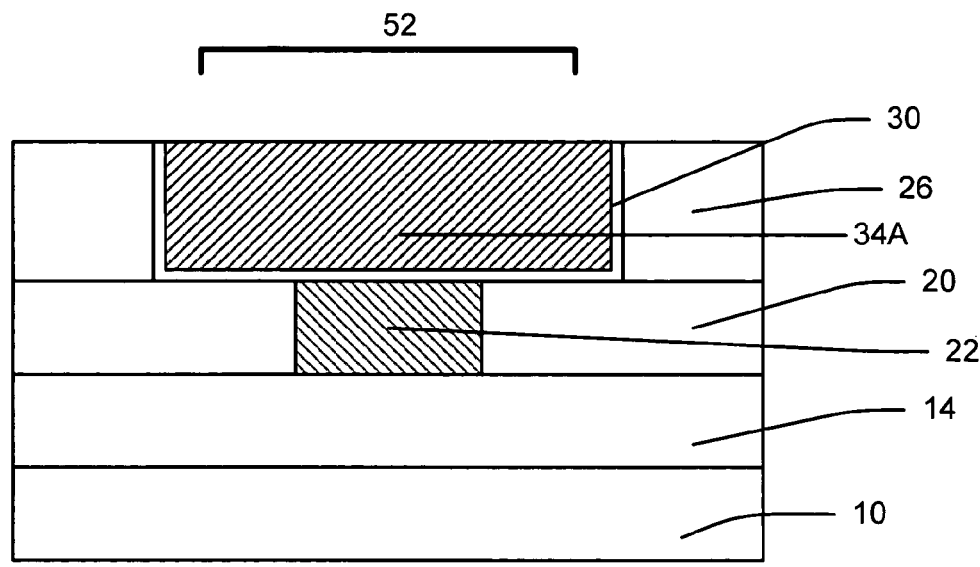

As show in FIG. 3, the conductive buffer layer 34 is planarized to form a buffer pad 34A filling the buffer opening 32 and to remove the barrier layer 30 over the buffer dielectric layer 26. Preferably the planarization of the conductive buffer layer 34 comprises a chemical-mechanical polish (CMP) step. The conductive buffer pad 34A preferably has a thickness between about 6750 and 8250 Å.

The conductive buffer pad 34A is not a metal wiring layer. The conductive buffer pad 34A is not comprised of a metal wiring layer and is not formed in the same metal deposition/patterning steps as a metal wiring layer. The conductive buffer layer only connects between the top wiring layer and the bond pad. No other interconnections are made by the conductive buffer layer.

The conductive buffer pad 34A preferably is solid with no openings or via passing through the buffer pad.

Passivation Layer 40

Figure 4:
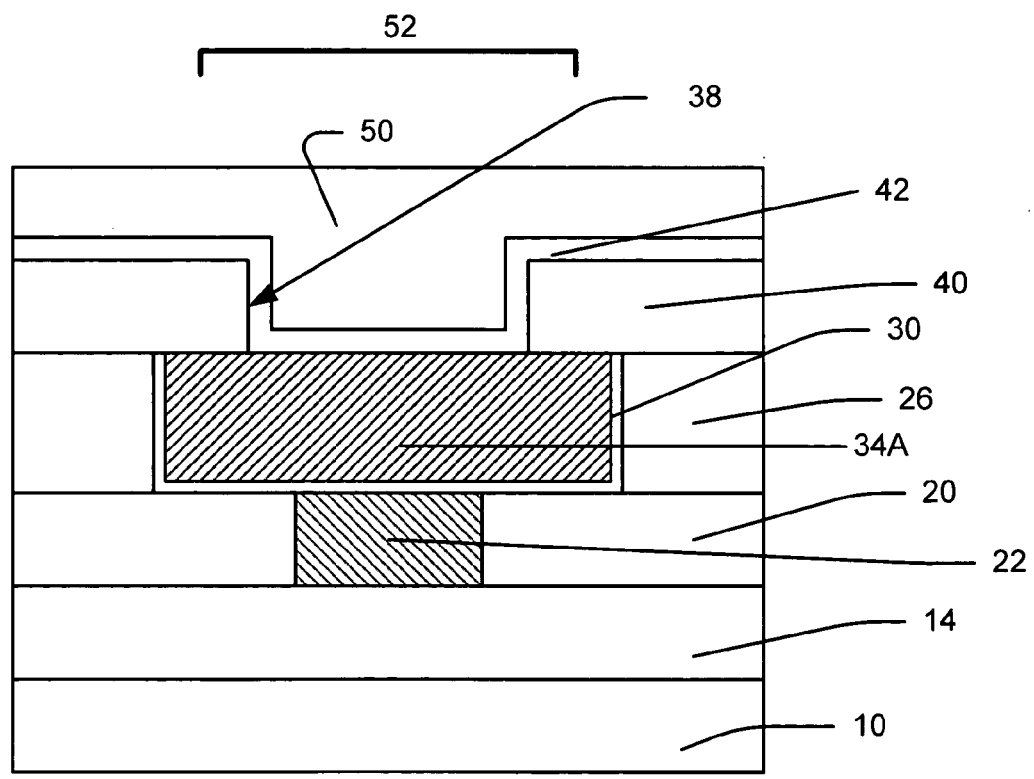

Referring to FIG. 4, we form a passivation layer 40 over the conductive buffer layer 34 and the buffer dielectric layer 26.

The passivation layer 40 is preferably comprised of three layers of (1) silicon nitride layer (2) an undoped silicate glass (USG) layer and (3) a silicon nitride (SiN). The (1) silicon nitride layer preferably has a thickness between 1350 and 1650 Å and more preferably about 1500 Å. The (2) USG layer preferably has thickness between 7650 and 9350 Å and more preferably of about 8500 angstroms; and the (3) silicon nitride (SiN) layer preferably has a thickness between 5400 and 6600 Å and more preferably of about 6000 angstroms.

Bond Pad Opening 38

Next, we form a bond pad opening 38 in the a passivation layer 40 over at least a portion of the buffer pad 34A in the bond pad area.

The buffer opening is preferably larger than the bond pad opening 38. The buffer opening preferably extends beyond the bond pad opening.

The buffer opening 32 (and therefore the buffer pad 34A) can be made larger than the bond pad 50A (Al cap) as long as the pitch size allowed. This may help to dissipate bonding stress to the larger interface between conductive buffer layer 34A and dielectric layer 20.

Bond Pad Support Layer 42

Referring to FIG. 4, we form a bond pad support layer 42 over the buffer pad 34A and the buffer dielectric layer 26.

The support layer 42 functions to as additional support for the subsequently formed bonding pad 50A and the buffer pad 34A.

The (bond pad) support layer 42 is preferably comprised of Ti or TiW, or Cr. The support layer 42 comprised of Ti or TiW, or Cr have a superior level of mechanical strength so the layer can act as a "rigid support" to support the wire-bonding. The support layer 42 is preferably comprised of Ti, TiW or Cr and less preferably comprised of Ta because the former are more ductile and provide better support in the embodiment's structure. In addition, the support layer 42 is preferably not comprised of Ta because good adhesion between the buffer pad 34A (e.g., Al) 34A and bonding pad layer (e.g., Al) 50 is required. The support layer 42 preferably has thickness between 2000 and 6000 Å.

The support layer is preferably comprised of metal such as Ti, TiW, W, Cr etc.) that serves as supporter layer. Support layer's 42 comprised of Ti, TiW and Cr have been shown to have superior adhesion with Al so that barrier layer can combine the two Al layers 34A 50. The support layer comprised of Ti, TiW, W, or Cr is not a barrier layer since it does not function as a barrier. The support layer is between the buffer pad 34A and the bonding pad 50 which are preferably comprised of aluminum.

The embodiment's structure with the Al buffer layer 34A and support layer 42 absorb energy from the bonding process and reduce defects. In addition, the Al buffer layer can be made larger that the Al bonding pad 50A so that the bonding stress can be dissipated.

Bond Pad Layer 50

Still referring to FIG. 4, we form a bond pad layer 50 over the bond pad support layer 42.

The bond pad layer 50 is preferably comprised of an Al—Cu alloy. The bond pad layer is preferably comprised of Al with between 99.45 to 99.55 wt % and Cu between 0.45 to 0.55 wt %. The bond pad layer 50 preferably has a thickness between 6000 and 15000 Å.

Bond Pad 50A and Bond Pad Support 42A

Figure 5:
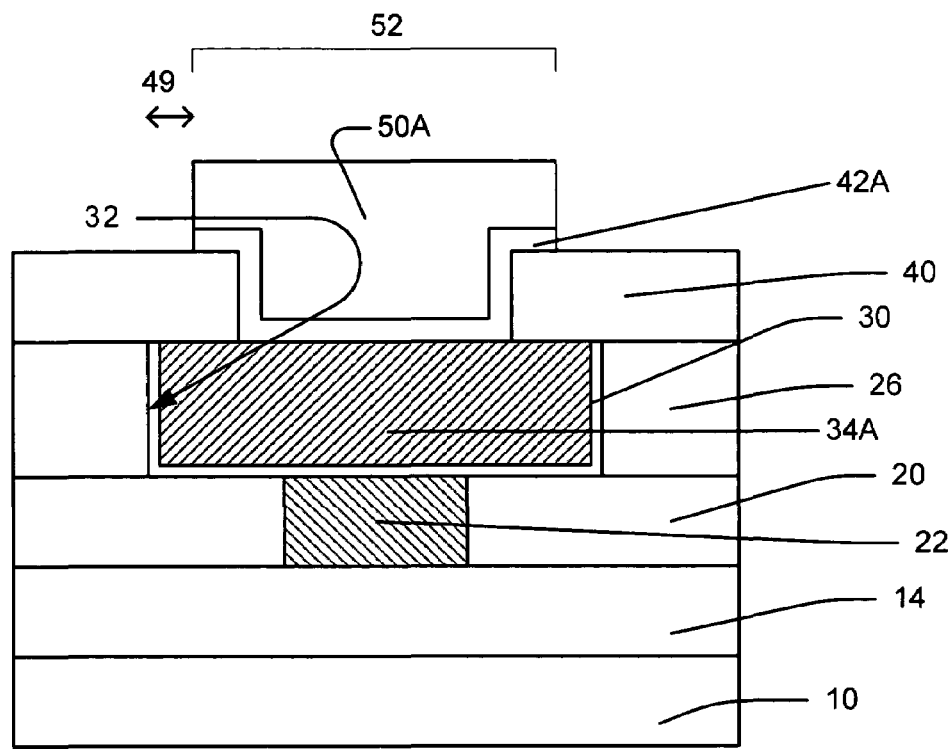

As shown in FIG. 5, we pattern the bond pad layer 50 and the bond pad support layer 42 to form a bond pad 50A and bond pad support 42A. The bond pad layer and the bond pad support layer 42 can be patterned by a photoresist mask and etch process. The bond pad 50A can have an area between 2500 and 10000 sq μm.

Aspects of the Shapes of the Buffer Pad

Figure 6:
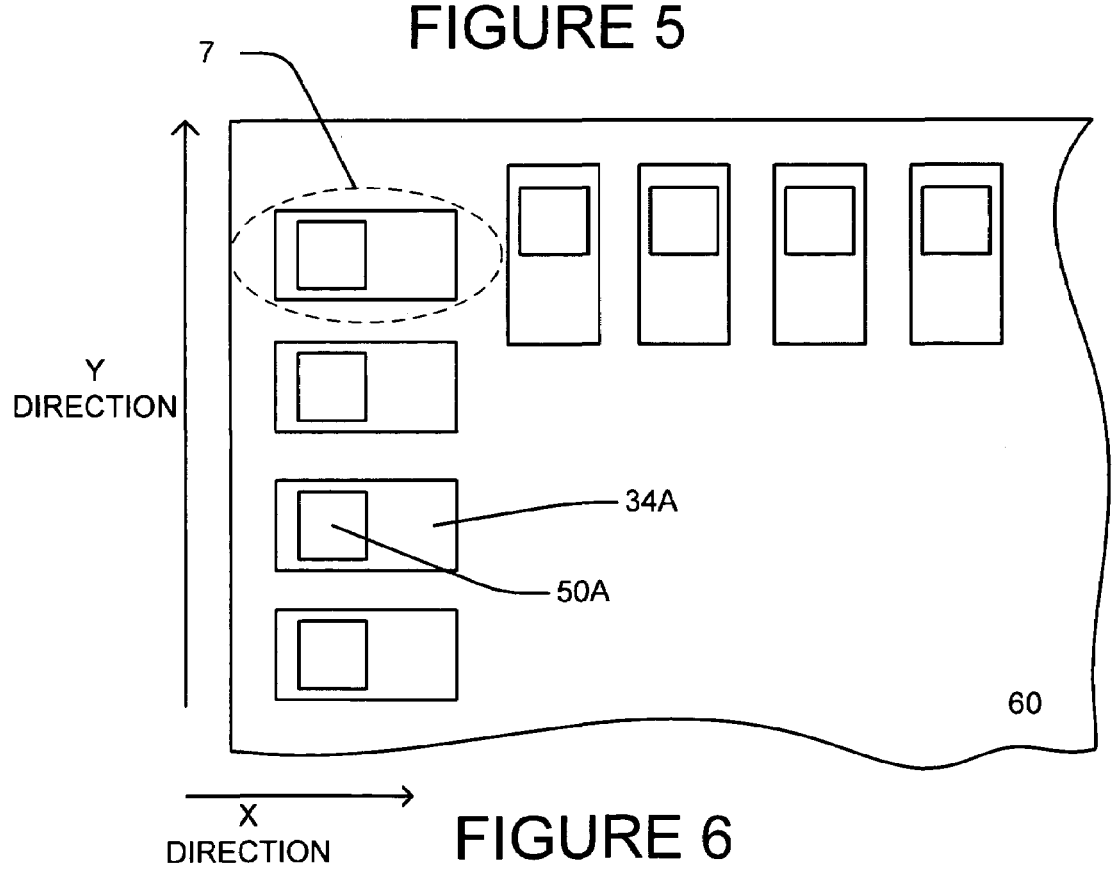
FIG. 6 shows a top down view of a section of a die with the bond pads 50A and the buffer pads 34A according to an embodiment of the present invention.

FIG. 6 shows a top down view of a section of a die 60 with the bond pads 50A and the buffer pads 34A according to an embodiment of the present invention. The bond pads are normally located on the peripheral of the die. For bond pads (circled 7) orientated along the edge in the y axis, the pitch along the Y direction usually critical, while the spacing along the X direction is normally not tightly controlled. Therefore, the embodiments design of the buffer pad 34A and bond pad support 42A can be extended beyond the bond pad 50A usually a greater length in the x direction to make it more rectangular in shape. In a preferred embodiment, the buffer pad 34A had a larger area than the bond pad 50A. The buffer pad 34A preferably has an area between about 10% and 30% larger than the bond pad 50 area. The buffer pad 34A preferably underlies the entire bond pad 50A and preferably laterally extends past the bond pad 52A a distance 49 between 4 and 12 μm.

Figure 7:
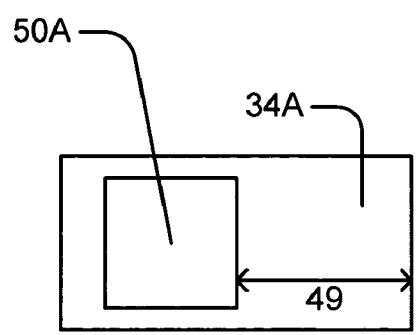
FIG. 7 shows a top down view of the bond pad 50A (circled in FIG. 6 and labeled 7) and the rectangular shaped. buffer pad 34A according to an embodiment of the present invention.

FIG. 7 shows a top down view of the bond pad 50A circled in FIG. 6 and labeled (7) (orientated along the Y periphery of the die) and the rectangular shaped. buffer pad 34A according to an embodiment of the present invention.

Figure 8:
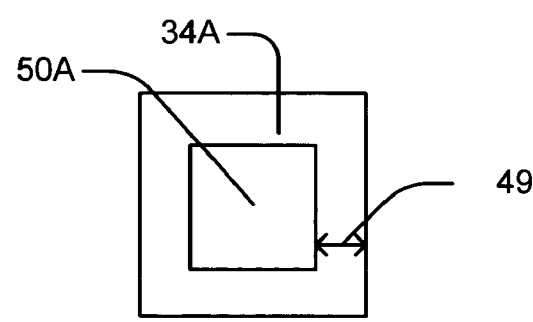
FIG. 8 shows a top down view of the bond pad and the square shaped buffer pad according to an embodiment of the present invention.

FIG. 7 shows how the buffer pad 34A (and support 42A) can extend a distance 49 out beyond the bond pad 50A, FIG. 8 shows a top down view of the bond pad and the square shaped. buffer pad according to an embodiment of the present invention. FIG. 8 shows a top down view of the bond pad 50A circled in FIG. 6 and labeled (7) (orientated along the Y periphery of the die) and the square shaped buffer pad 34A according to an embodiment of the present invention. FIG. 7 shows how the buffer pad 34A (and support 42A) can extend a distance 49 out beyond the bond pad 50A.

Aspects

According to studies, higher bonding force and energy was needed for wire bonding on Cu/Low K device compared to the bonding over SiO2 in order to perform good wire-bonding. Therefore, a rigid platform for bonding is important in the bond-pad design. In addition, thicker Al bond pad 50A which is ductile and easy to be deformed can also help to absorb the bonding energies. The advantages of aspects of this new design are:

(1) The (bond pad) support layer 42 is formed of supporting metal such as Ti, TiW, Cr (rather than Ta) to serve as both barrier and supporter.

(2) There are two rigid supporters: (1) Buffer conductive pad 34A and (2) support layer 42).

(3) The buffer conductive pad 34A and bond pad 50A can help to absorb more ultra-sonic or mechanical stresses during bonding to minimize the bonding impact on underlying Cu/Low K stacks.

(4) The buffer conductive pad 34A can be made larger than the bond pad 50A as long as the pitch size allowed. This may help to dissipate bonding stress to the larger interface between buffer conductive layer 34 (Al buffer) and TEOS or FTEOS dielectrics.

The term "aluminum" includes alloys of aluminum of the kind typically used in the semiconductor industry. Such alloys include aluminum-copper alloys, and aluminum-copper-silicon alloys.

The above advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, these features and advantages should not be considered dispositive in determining equivalence.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a bond pad structure, comprising the steps of:
   a) providing a top wiring layer and a top dielectric layer over a semiconductor structure;
   b) forming a buffer dielectric layer over said top wiring layer and said top dielectric layer;
   c) forming a buffer opening in said buffer dielectric layer exposing at least of portion of said top wiring layer;
   d) forming a barrier layer over said buffer dielectric layer, and said top wiring layer in said buffer opening;
   a) forming a conductive buffer layer over said barrier layer;
   f) planarizing said conductive buffer layer to form a buffer pad in said buffer opening;
   g) forming a passivation layer over said buffer pad and said buffer dielectric layer;
   h) forming a bond pad opening in said passivation layer over at least a portion of said buffer pad;
   i) forming a bond pad support layer over said buffer pad and passivation layer;
   j) forming a bond pad layer over said bond pad support layer;
   k) patterning said bond pad layer and said bond pad support layer to form a bond pad and bond pad support.

2. The method of claim 1 wherein said top wiring layer is comprised of Cu alloy; said top wiring layer is a damascene interconnect.

3. The method of claim 1 wherein said top dielectric layer is comprised of oxide made from tetraethylorthosilicate (TEOS) reactants and has a thickness between 6750 and 8250 Å.

4. The method of claim 1 wherein said top dielectric layer is comprised an oxide based low k dielectric material with a K equal or less than 3.0.

5. The method of claim 1 wherein said buffer dielectric layer is comprised of TEOS oxide and has a thickness between 6750 and 8250 Å.

6. The method of claim 1 wherein said barrier layer is comprised of Ta or a bilayer comprised of a Cr layer and a Cr—Cu layer, said barrier layer has a thickness between 360 and 440 Å.

7. The method of claim 1 wherein said buffer pad is comprised of an aluminum alloy with between a 99.45 and 99.55 wt % aluminum and between 0.45 and 0.55 wt % copper.

8. The method of claim 1 wherein the planarization of said conductive buffer layer comprises a chemical-mechanical polish step.

9. The method of claim 1 wherein said passivation layer is comprised of a three layer stricture of (1) lower silicon nitride layer, (2) undoped silicate glass layer and (3) upper silicon nitride layer; and has a thickness between 13500 and 16500 Å.

10. The method of claim 1 wherein said bond pad opening has an area between 2500 and 10000 sq $\mu$m.

11. The method of claim 1 wherein said buffer opening is larger than said bond pad opening; said buffer opening extends beyond said bond pad opening on all sides.

12. The method of claim 1 wherein said bond pad support layer is comprised of a material selected from the group consisting of Ti, TiW, W and Cr; and has thickness between 2000 and 6000 Å.

13. The method of claim 1 wherein said bond pad layer comprised of an Al—Cu alloy with Al between 99.45 and 99.55 wt % and Cu between 0.45 and 0.55%; said bond pad layer has a thickness between 6000 and 15000 Å; and said buffer pad underlies the entire bond pad.

14. The method of claim 1 wherein said buffer pad underlies the entire bond pad; said buffer pad has a larger area than said bond pad by between 10% and 30% of the area of the bonding pad.

15. A method of fabrication of a bond pad structure, comprising the steps of:
providing a top wiring layer and a top dielectric layer over a semiconductor structure;
forming a buffer dielectric layer over said top wiring layer and said top dielectric layer;
forming a buffer opening in said buffer dielectric layer exposing at least of portion of said top wiring layer;
forming a buffer pad in said buffer opening;
forming a passivation layer over said buffer pad and said buffer dielectric layer;
forming a bond pad opening in said passivation layer over at least a portion of said buffer pad;
forming a bond pad and bond pad support at least in said bond pad opening;
said bond pad is electrically connected to said buffer pad.

16. The method of claim 15 wherein said buffer pad is comprised of an aluminum alloy with between 99.45 and 99.55 wt % aluminum and between 0.45 and 0.55 wt % copper.

17. The method of claim 15 wherein said buffer opening is larger than said bond pad opening; said buffer opening extends beyond said bond pad opening on all sides.

18. The method of claim 15 wherein said bond pad support layer is comprised of a material selected from the group consisting of Ti, TiW. W and Cr; and has thickness between 2000 and 6000 Å.

19. The method of claim 15 wherein said bond pad layer comprised of an Al—Cu alloy; said bond pad is comprised of aluminum; and said buffer pad underlies the entire bond pad.

20. A method of fabrication of a bond pad structure, comprising the steps of:
providing a top wiring layer and a top dielectric layer over a semiconductor structure;
forming a buffer dielectric layer over said top wiring layer and said top dielectric layer;
forming a buffer opening in said buffer dielectric layer exposing at least of portion of said top wiring layer;
forming a buffer pad in said buffer opening;
forming a passivation layer over said buffer pad and said buffer dielectric layer;
forming a bond pad opening in said passivation layer over at least a portion of said buffer pad;
forming a bond at least in said bond pad opening; said bond pad is electrically connected to said buffer pad.

21. The method of claim 20 which further includes forming a bond pad support over
said buffer pad in said bond pad opening; and
said bond pad over said bond pad support.

22. The method of claim 20 which further includes forming a bond pad support over
said buffer pad in said bond pad opening; and
said bond pad over said bond pad support;
said buffer pad is comprised of an aluminum alloy and said bond is comprised of an aluminum alloy.

23. The method of claim 20 wherein said buffer pad is comprised of an aluminum alloy and said bond pad is comprised of an aluminum alloy.

24. The method of claim 20 wherein said bond pad support is comprised of a material selected from the group consisting of Ti, TiW, W and Cr.

25. The method of claim 20 wherein said bond comprised of an Al—Cu alloy;
said buffer pad is comprised of Aluminum; said bond pad support is comprised of a
material selected from the group consisting of Ti, TiW, W and Cr;
and said buffer pad underlies the entire bond pad.

* * * * *